United States Patent
Chandrashekar et al.

(10) Patent No.: US 10,340,177 B2
(45) Date of Patent: Jul. 2, 2019

(54) DEVICES AND METHODS OF REDUCING DAMAGE DURING BEOL M1 INTEGRATION

(71) Applicant: GLOBALFOUNDRIES Inc., Grand Cayman (KY)

(72) Inventors: Ashwini Chandrashekar, Clifton Park, NY (US); Anbu Selvam Km Mahalingam, Malta, NC (US); Craig Michael Child, Jr., Gansevoort, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 24 days.

(21) Appl. No.: 15/048,493

(22) Filed: Feb. 19, 2016

(65) Prior Publication Data
US 2017/0243783 A1    Aug. 24, 2017

(51) Int. Cl.
*H01L 21/02* (2006.01)
*H01L 21/311* (2006.01)
(Continued)

(52) U.S. Cl.
CPC .... *H01L 21/76802* (2013.01); *H01L 21/0214* (2013.01); *H01L 21/02126* (2013.01);
(Continued)

(58) Field of Classification Search
CPC ......... H01L 21/76802; H01L 21/02126; H01L 21/0214; H01L 21/3111; H01L 21/31144;
(Continued)

(56) References Cited

U.S. PATENT DOCUMENTS

| 2009/0061634 A1* | 3/2009 | Feurprier | H01L 21/31144 438/700 |
| 2013/0037890 A1* | 2/2013 | Tseng | H01L 27/14614 257/411 |

(Continued)

OTHER PUBLICATIONS

H. Cui, "TiN Metal Hardmask Etch Residue Removal with Mask Pullback and Complete Mask Removal for Cu Dual Damascene Device", IEEE, Advanced Semiconductor Manufacturing Conference (ASMC) 2012, pp. 305-307.

*Primary Examiner* — Zandra V Smith
*Assistant Examiner* — Andre' C Stevenson
(74) *Attorney, Agent, or Firm* — Thompson Hine LLP; Francois Pagette

(57) ABSTRACT

Intermediate semiconductor devices and methods of reducing damage during back end of the line (BEOL) metallization and metal one (M1) layer integration scheme are provided. One method includes, for instance: obtaining a wafer having at least one contact region; depositing on the wafer a thin film stack having at least one layer of amorphous silicon (a-Si); performing lithography to pattern at least one opening; performing lithography to pattern at least one via opening and at least one trench opening; and removing the at least one a-Si layer. One intermediate semiconductor device includes, for instance: a wafer having at least one contact region; at least one first dielectric layer on the device; at least one second dielectric layer on the at least one first dielectric layer; and at least one a-Si layer on the at least one second dielectric layer.

10 Claims, 3 Drawing Sheets

(51) Int. Cl.
*H01L 21/768* (2006.01)
*H01L 21/00* (2006.01)
*H01L 23/522* (2006.01)
*H01L 23/532* (2006.01)

(52) U.S. Cl.
CPC ... *H01L 21/31111* (2013.01); *H01L 21/31144* (2013.01); *H01L 21/76877* (2013.01); *H01L 23/5226* (2013.01); *H01L 23/53228* (2013.01); *H01L 23/53295* (2013.01)

(58) Field of Classification Search
CPC .......... H01L 21/76877; H01L 23/5226; H01L 23/53228; H01L 23/53295
See application file for complete search history.

(56) References Cited

U.S. PATENT DOCUMENTS

| | | | |
|---|---|---|---|
| 2013/0095619 A1* | 4/2013 | Wehella-Gamage | H01L 29/66636 438/164 |
| 2013/0236989 A1* | 9/2013 | Ranjan | H01L 21/02063 438/5 |
| 2015/0035168 A1* | 2/2015 | Tezcan | H01L 21/76898 257/774 |
| 2015/0084157 A1* | 3/2015 | Tegen | H01L 21/822 257/528 |
| 2015/0162487 A1* | 6/2015 | Deshazer | H01L 21/268 438/57 |
| 2016/0172231 A1* | 6/2016 | Lee | H01L 21/7682 438/643 |
| 2018/0182708 A1* | 6/2018 | Ahmed | H01L 23/53209 |

* cited by examiner

DEVICES AND METHODS OF REDUCING DAMAGE DURING BEOL M1 INTEGRATION

FIELD OF THE INVENTION

The present invention relates generally to semiconductor devices and methods of fabricating semiconductor devices, and more particularly, to devices and methods of reducing damage during the back end of the line (BEOL) metallization phase and metal one (M1) integration scheme.

BACKGROUND OF THE INVENTION

In semiconductor device fabrication, after the devices are created, for example, transistors are formed in front end of the line (FEOL), and are interconnected in back end of the line (BEOL). Electrical connections to the devices, also referred to as "metallization", are in the back end of the line (BEOL).

In the current integration scheme for metal one (M1) Trench First Metal Hard Mask (TFMHM), the use of wet chemistries to remove titanium nitride (TiN) hard mask layer will also attack the exposed metal material, for example, titanium (Ti), titanium nitride (TiN) and/or tungsten (W), in the contact module below M1, resulting in the attack and the loss of the exposed metal material.

Therefore, it may be desirable to develop methods of using an alternative hard mask to replace TiN, so that the hard mask may be removed in the M1 TFMHM module without damaging the exposed metal material in the contact module.

BRIEF SUMMARY

The shortcomings of the prior art are overcome and additional advantages are provided through the provision, in one aspect, a method that includes, for instance: obtaining a wafer having at least one contact region; depositing on the wafer a thin film stack having at least one hard mask layer; performing lithography to pattern at least one opening; performing lithography to pattern at least one via opening and at least one trench opening; and removing the at least one hard mask layer.

In another aspect, an intermediate semiconductor device is provided which includes, for instance: a wafer having at least one contact region; at least one first dielectric layer disposed on the device; at least one second dielectric layer disposed on the at least one first dielectric layer; and at least one a-Si layer disposed on the at least one second dielectric layer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit device fabrication processes disclosed herein provide for semiconductor devices with better aspect ratio and better barrier fill.

Figure 1:
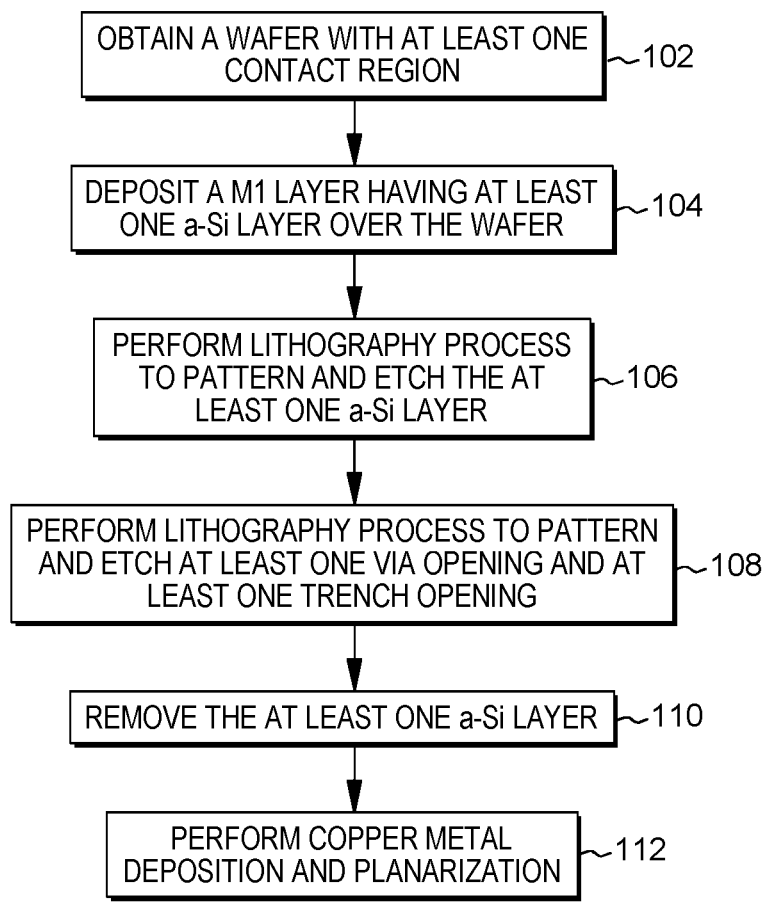
FIG. 1 depicts one embodiment of a method for reducing damage during the integration of a metal one (M1) layer, in accordance with one or more aspects of the present invention.

In one aspect, in one embodiment, as shown in FIG. 1, an integrated circuit device formation process in accordance with one or more aspects of the present invention may include, for instance: obtaining a wafer having at least one contact region 102; depositing over the wafer a metal one (M1) thin film stack having at least one layer of amorphous silicon (a-Si) 104; performing lithography process to pattern and etch at least one opening within the at least one a-Si layer 106; performing lithography process to pattern and etch at least one via opening and at least one trench opening in the wafer 108; removing the at least one a-Si layer 110; and performing copper (Cu) metal deposition process and planarization 112.

One detailed embodiment of a portion of the semiconductor device formation process of FIG. 1 is depicted, by way of example only, in FIGS. 2-6, in accordance with one or more aspects of the present invention.

Figure 2:
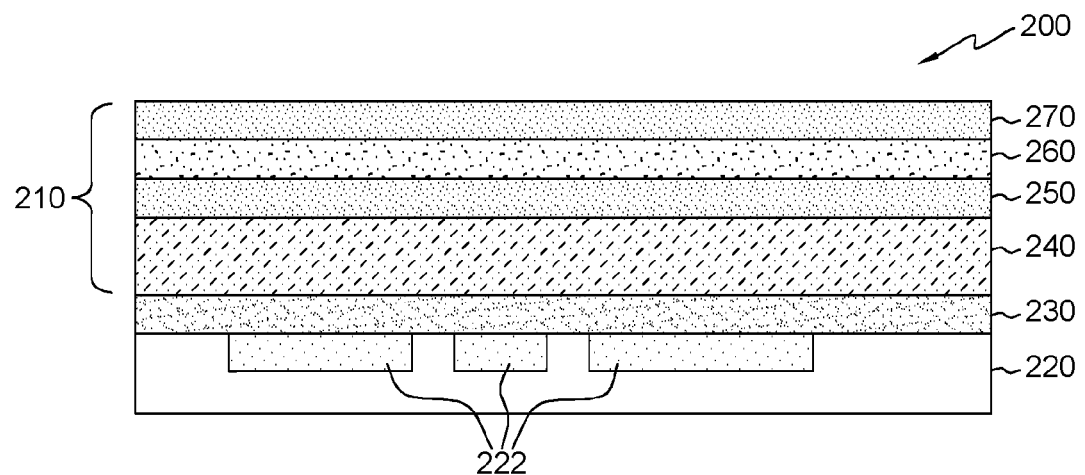
FIG. 2 depicts a cross-sectional elevation view of one embodiment of an intermediate semiconductor device after depositing a thin film stack, in accordance with one or more aspects of the present invention.

FIG. 2 depicts a portion of an intermediate semiconductor device 200 obtained during the fabrication process. The device 200 may have been processed through initial device processing steps in accordance with the design of the device 200 being fabricated, for example, the device 200 may include, for instance, a substrate 220 with at least one contact region 222. The device 200 may also include at least one isolation region (not shown), source regions (not shown), drain regions (not shown) and the like. The at least one contact region 222 may be composed of metal, for example, tungsten (W), titanium nitride (TiN), or titanium (Ti). The device 200 may also have an etch stop layer 230 disposed on the substrate 220 and on the at least one contact region 222. The etch stop layer 230 may be, for example, a layer of nitrogen-doped silicon carbide (NDC).

As depicted in FIG. 2, a thin film stack 210 may be deposited over the device 200 and may be disposed on the device 200, for instance, in direct contact with the device 200. The thin film stack 210 may be deposited using any conventional deposition process, for example, chemical vapor deposition (CVD) or physical layer deposition (PVD). The thin film stack 210 may include, for example, at least one first dielectric layer 240, at least one second dielectric layer 250, a hard mask layer 260, and at least one third dielectric layer 270. The thin film stack 210 may be, for example, a metal one (M1) layer. The at least one first dielectric layer 240 may be, for example, a dielectric material having silicon, carbon, oxygen, and hydrogen (SiCOH) composition. For instance, the at least one first dielectric layer 240 may be referred to as a SiCOH layer, and may include any combination of silicon, carbon, oxygen, and hydrogen. The at least one second dielectric layer 250 and the at least one third dielectric layer 270 may each be, for example, a silicon oxynitride (SiON) layer. The hard mask layer 260 may be, for example, an amorphous silicon (a-Si) layer.

As also depicted in FIG. 2, the at least one first dielectric layer 240 may be deposited over the device 200 and disposed directly on the device 200. The at least one second dielectric layer 250 may be deposited over the device 200 and disposed on the at least one first dielectric layer 240. A hard mask layer 260 may be deposited and disposed on the at least one first dielectric layer 240. The at least one third dielectric layer 270 may then be deposited and disposed on the hard mask layer 260.

Figure 3:
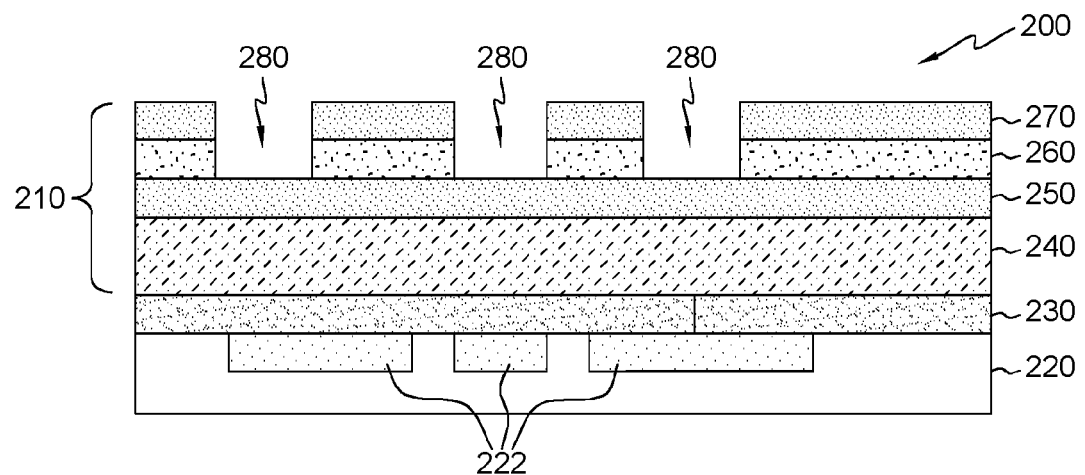
FIG. 3 depicts the cross-sectional elevation view of the structure of FIG. 2 after patterning and etching at least one layer of amorphous silicon (a-Si), in accordance with one or more aspects of the present invention.

As depicted in FIG. 3, lithography may be performed to pattern and etch at least one opening 280. The lithography may be performed by known methods including applying a lithography stack (not shown) over the device 200, patterning the lithography stack (not shown) and then etching into the third dielectric layer 270 and the hard mask layer 260 to form the at least one opening 280.

Figure 4:
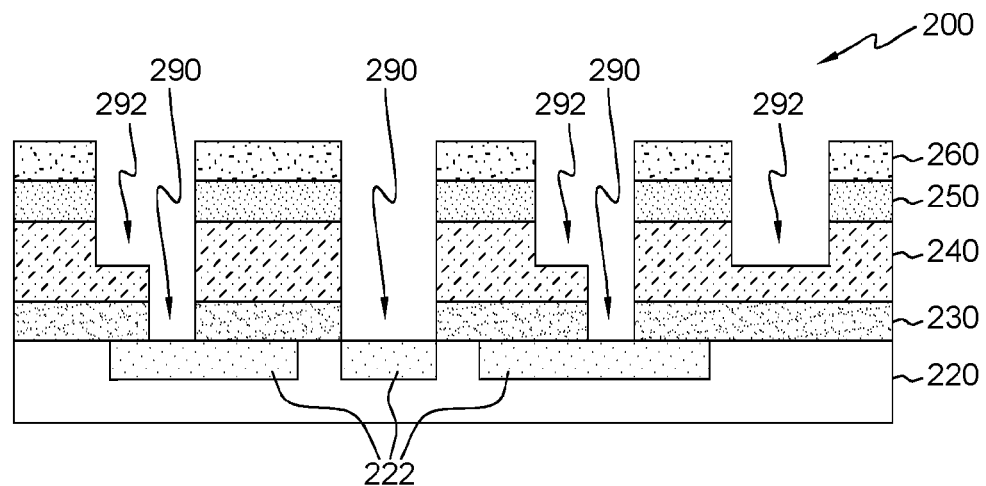
FIG. 4 depicts the cross-sectional elevation view of the structure of FIG. 3 after patterning and etching at least one via opening and at least one trench opening, in accordance with one or more aspects of the present invention.
Figure 5:
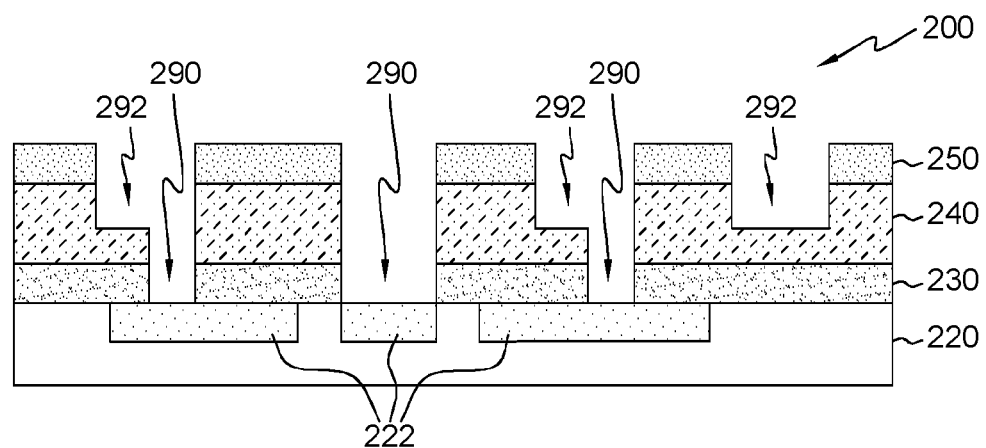
FIG. 5 depicts the cross-sectional elevation view of the structure of FIG. 4 after removing the at least one a-Si layer, in accordance with one or more aspects of the present invention.

Next, as depicted in FIG. 4, once the at least one opening 280 is formed, a full etch may be performed to form at least one via or via opening 290 and at least one trench or trench opening 292. The at least one via opening 290 may be, for example, etched down to expose the at least one contact region 222. The at least one third dielectric layer 270 may also be removed during this process. After the formation of at least one via opening 290 and at least one trench opening 292, the hard mask layer 260 may be removed or stripped, as depicted in FIG. 5. The hard mask layer 260 may be removed or stripped by, for example, a wet cleanse, wet etching, or anisotropic etching. For example, an amorphous silicon (a-Si) hard mask layer may be removed by a tetramethyl ammonium hydroxide (TMAH) solution.

Figure 6:
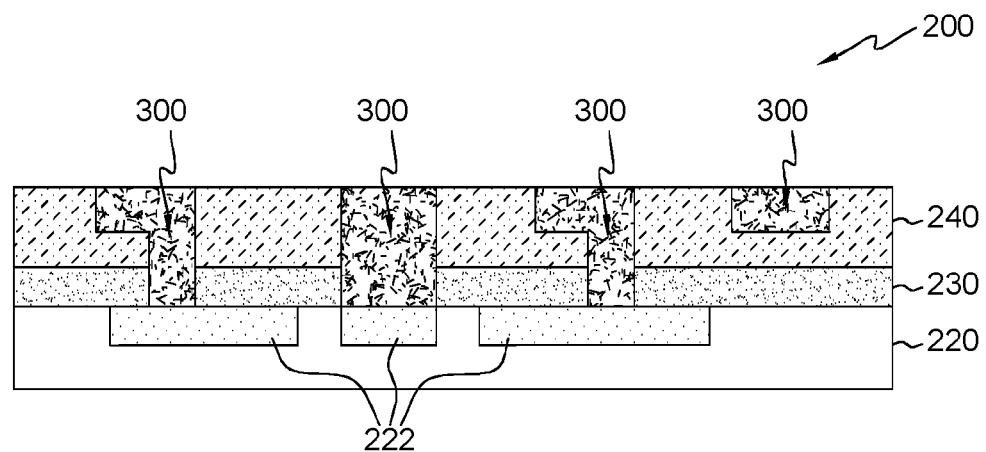
FIG. 6 depicts the cross-sectional elevation view of the structure of FIG. 5 after copper metallization and planarization processes, in accordance with one or more aspects of the present invention.

After the hard mask layer 260 is removed, a metal deposition process may be performed to deposit at least one metal layer 300 over the device 200, filling the at least one via opening 290 and at least one trench opening 292. The metal deposition process may be any suitable metal deposition process known in the art. After the deposition, the metal layer 300 may be planarized. The finished vias 290 and trenches 292 are depicted in FIG. 6, after planarization is performed. Planarization process may be any known in the art, for example, chemical mechanical planarization (CMP). As also depicted in FIG. 6, the metal deposition process and/or the planarization process may also remove or strip the at least one second dielectric layer 250.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:

obtaining a wafer comprising at least one contact region and at least one etch stop layer disposed directly on a substrate of the wafer;

depositing directly on the wafer a thin film stack comprising at least one first dielectric layer disposed directly on the wafer, at least one second dielectric layer disposed directly on the at least one first dielectric layer, at least one hard mask layer disposed directly on the at least one second dielectric layer, wherein the at least one hard mask layer is an amorphous silicon (a-Si) layer, and at least one third dielectric layer disposed directly on the at least one hardmask layer, wherein the at least one second dielectric layer and the at least one third dielectric layer comprise silicon oxynitride;

performing lithography to pattern at least one opening;

performing lithography to pattern at least one via opening and at least one trench opening and removing the at least one third dielectric layer;

removing the at least one hard mask layer such that no hard mask remains;

performing metallization over the wafer with no liner in the at least one opening, the at least one via opening, and the at least one trench opening; and planarizing the wafer, wherein planarizing includes removing the at least one second dielectric layer.

2. The method of claim 1, wherein performing metallization comprises performing copper (Cu) metallization.

3. The method of claim 1, wherein the at least one first dielectric layer comprises silicon, carbon, oxygen, and hydrogen.

4. The method of claim 1, wherein the thin film stack is a metal one (M1) layer.

5. The method of claim 1, wherein the depositing a thin film stack comprises:

depositing at least one amorphous silicon (a-Si) layer over the at least one second dielectric layer; and depositing at least one third dielectric layer over the at least one a-Si layer.

6. The method of claim 5, wherein the at least one first dielectric layer comprises silicon, carbon, oxygen, and hydrogen.

7. The method of claim 5, wherein the at least one second and the at least one third dielectric layers comprise silicon oxynitride.

8. The method of claim 1, wherein the at least one hard mask layer is removed by anisotropic etching.

9. The method of claim 1, wherein the removing the at least one hard mask layer is performed with a tetramethyl ammonium hydroxide (TMAH) solution.

10. An intermediate semiconductor device comprising:

a wafer comprising at least one contact region and at least one etch stop layer disposed directly on a substrate of the wafer;

at least one first dielectric layer disposed directly on the wafer, wherein the at least one first dielectric layer comprises silicon, carbon, oxygen, and hydrogen;

at least one second dielectric layer disposed directly on the at least one first dielectric layer;

at least one amorphous silicon (a-Si) layer disposed directly on the at least one second dielectric layer;

at least one third dielectric layer disposed directly on the at least one amorphous silicon layer, wherein the at least one second dielectric layer and the at least one third dielectric layer comprise silicon oxynitride; and at least one opening, at least one via opening, and at least one trench opening, wherein there is no liner in any of the openings.

\* \* \* \* \*